(12) United States Patent
Gupta et al.

(10) Patent No.: US 11,210,241 B1
(45) Date of Patent: Dec. 28, 2021

(54) HIGH-LEVEL OUTPUT VOLTAGE TRAINING FOR NON-VOLATILE MEMORY

(71) Applicant: SANDISK TECHNOLOGIES LLC, Addison, TX (US)

(72) Inventors: Nitin Gupta, Karnataka (IN); Ashish Savadia, Karnataka (IN); Jayanth Thimmaiah, Karnataka (IN); Ramakrishnan Subramanian, Karnataka (IN); Rampraveen Somasundaram, Karnataka (IN); Shiv Harit Mathur, Karnataka (IN); Vinayak Ghatawade, Karnataka (IN); Siddesh Darne, Milpitas, CA (US); Venkatesh Ramachandra, Milpitas, CA (US); Elkana Richter, Tene, IL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/068,957

(22) Filed: Oct. 13, 2020

(51) Int. Cl.
*G06F 13/16* (2006.01)
*G11C 16/26* (2006.01)
*G11C 16/10* (2006.01)
*G11C 16/04* (2006.01)

(52) U.S. Cl.
CPC .......... *G06F 13/1668* (2013.01); *G11C 16/10* (2013.01); *G11C 16/26* (2013.01); *G11C 16/0483* (2013.01)

(58) Field of Classification Search
CPC ..... G06F 13/1668; G11C 16/10; G11C 16/20; G11C 16/0483
See application file for complete search history.

(56) References Cited

U.S. PATENT DOCUMENTS

| | | | |
|---|---|---|---|
| 6,356,106 B1 * | 3/2002 | Greeff | G06F 13/4086 326/30 |
| 6,380,758 B1 * | 4/2002 | Hsu | H03K 19/00384 326/30 |
| 2014/0043042 A1 * | 2/2014 | Billau | G06F 21/606 324/612 |
| 2016/0204782 A1 * | 7/2016 | Lee | H03K 19/017545 365/189.17 |

* cited by examiner

*Primary Examiner* — Henry Tsai
*Assistant Examiner* — John B Roche
(74) *Attorney, Agent, or Firm* — Morgan, Lewis & Bockius LLP

(57) ABSTRACT

A data storage system includes a storage medium including plurality of memory cells, a storage controller in communication with the storage medium, an electrical interface circuitry configured to pass data via a channel disposed between the storage medium and the storage controller; and voltage training circuitry configured to train a high-level output voltage (VOH) for each of a plurality of data lines of the channel. Training the VOH includes, for each of the plurality of data lines of the channel, calibrating a pull-up driver of the storage controller against an on-die termination circuit of the storage medium, calibrating a pull-down driver of the storage controller against the pull-up driver of the storage controller, and calibrating an on-die termination circuit of the storage controller against a pull-up driver of the storage medium.

20 Claims, 6 Drawing Sheets

Signaling Scheme 400

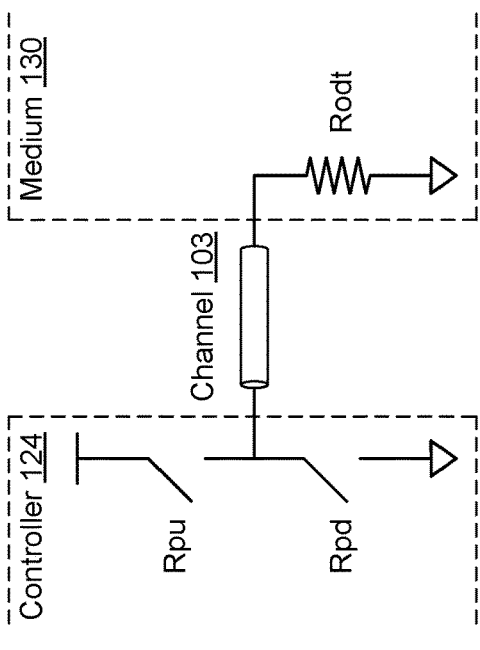
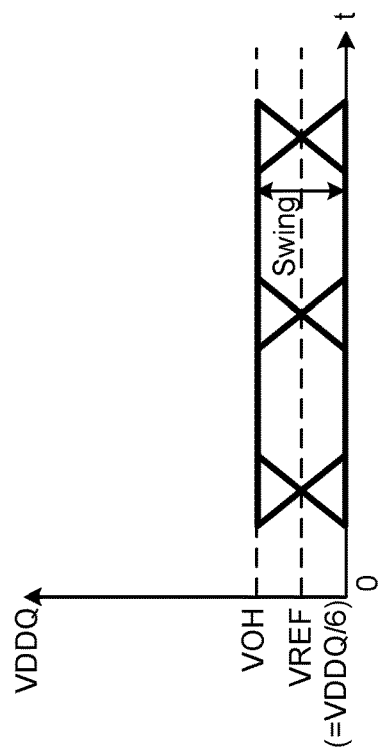
Figure 4
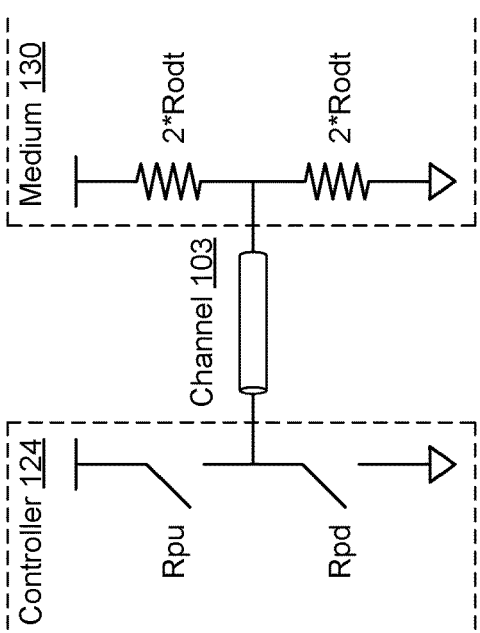
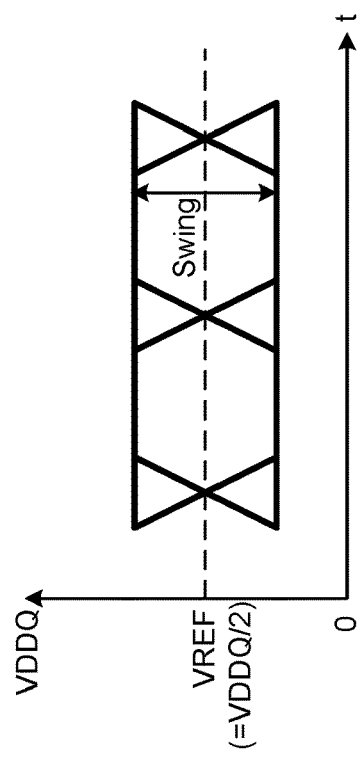
Figure 3

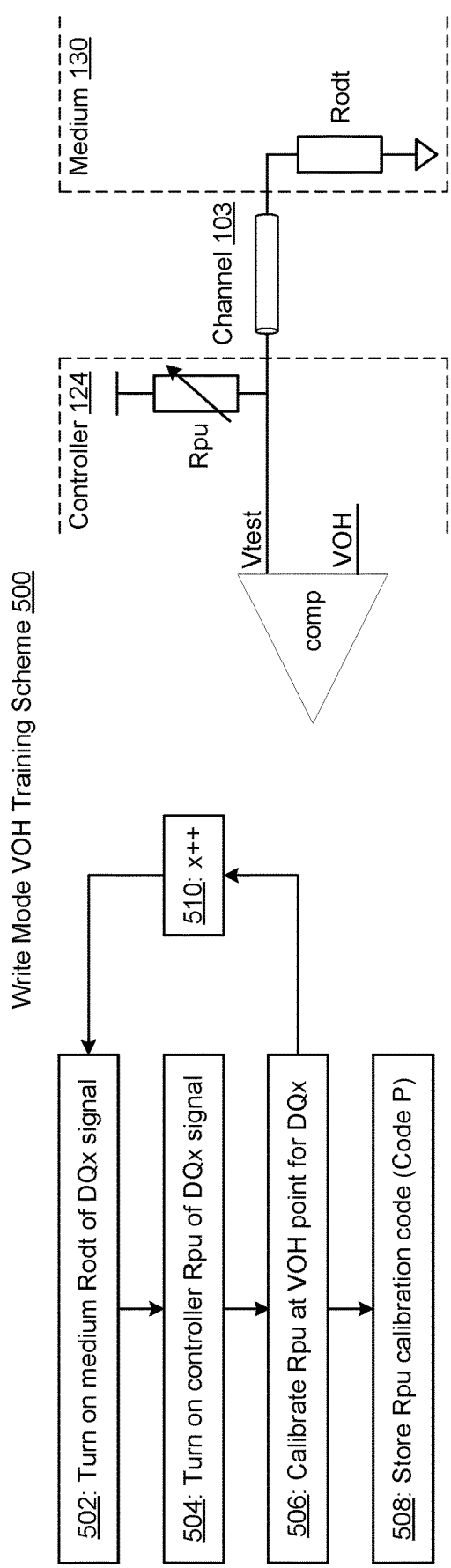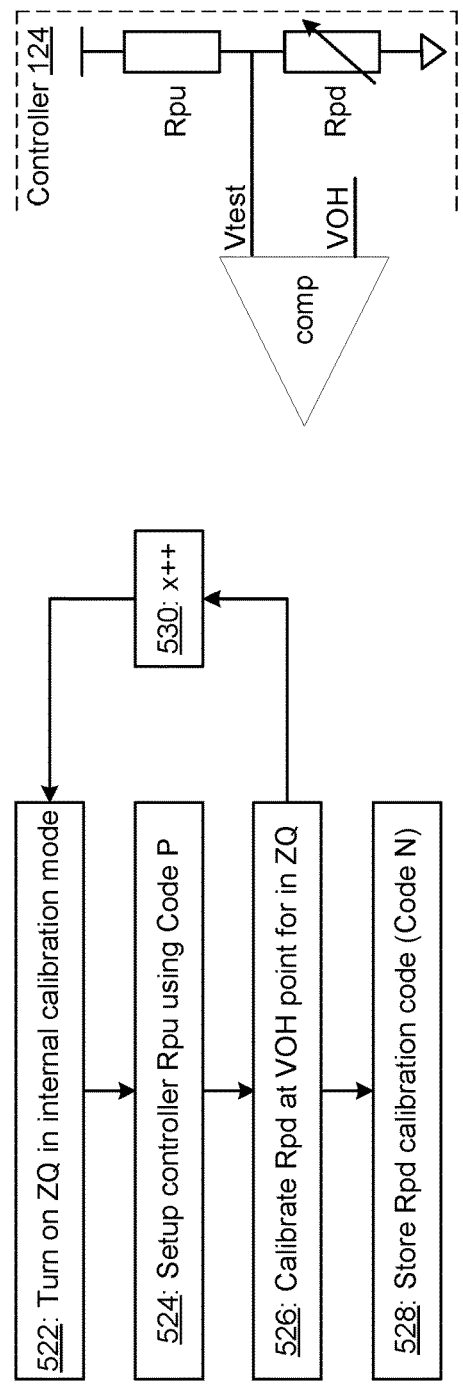

HIGH-LEVEL OUTPUT VOLTAGE TRAINING FOR NON-VOLATILE MEMORY

TECHNICAL FIELD

The present disclosure relates to data storage systems, and in particular, to a voltage training scheme at an interface between a storage controller and a storage medium of a data storage system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

This application describes various systems and methods of voltage training at an interface between a storage controller and a storage medium. Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface in a tunable and scalable manner.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 3 is a first signaling scheme at the interface of FIG. 2 in accordance with some implementations.

FIG. 4 is a second signaling scheme at the interface of FIG. 2 in accordance with some implementations.

FIGS. 5A-5B depict a voltage training scheme during a write mode in accordance with some implementations.

Figure 1:
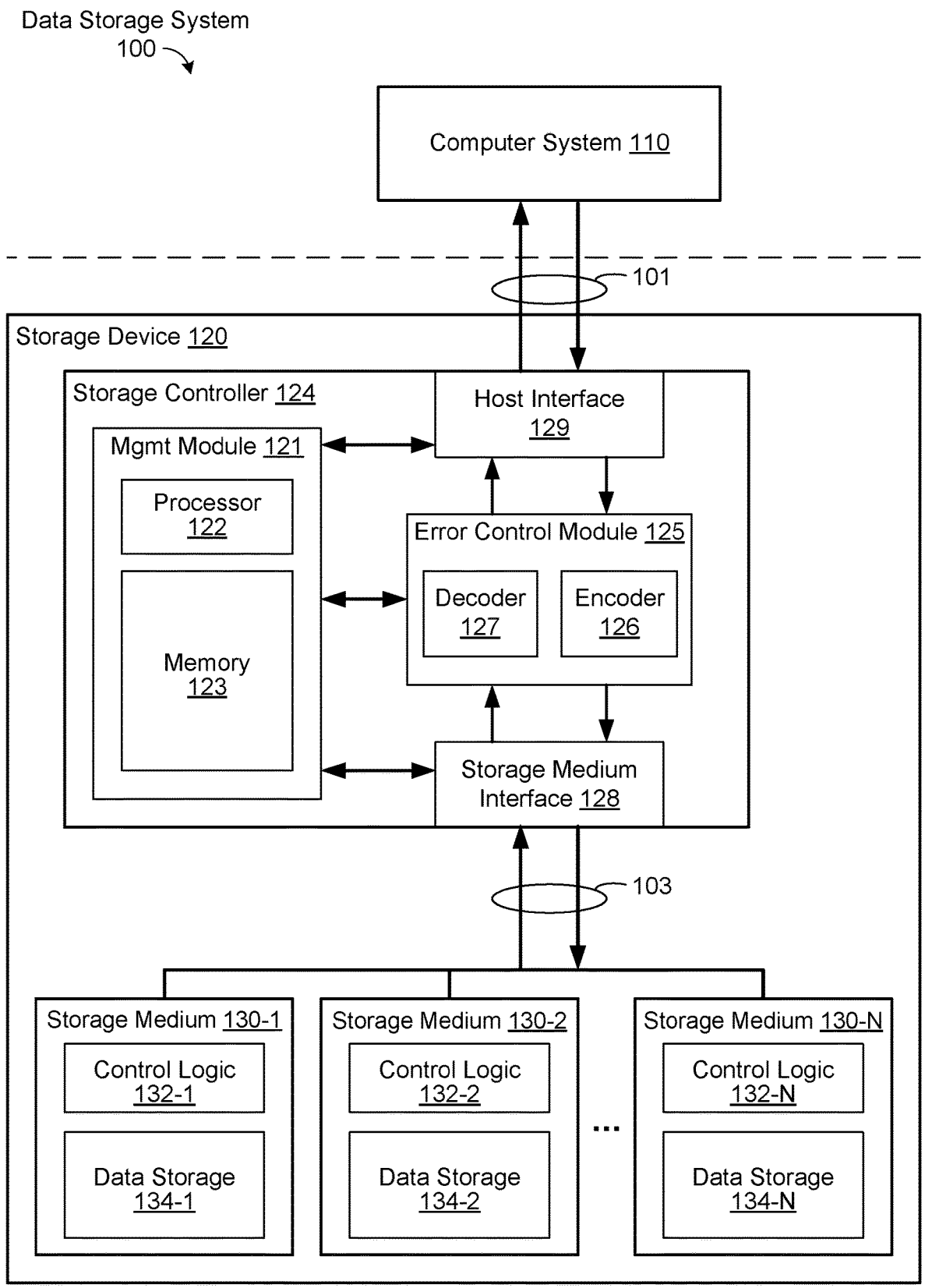
FIG. 1 is a block diagram of a data storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the data storage system 100 includes a data processing system (alternatively referred to herein as a computer system or host) 110, and a storage device 120.

The computer system 110 is coupled to the storage device 120 through data connections 101. In various implementations, the computer system 110 includes the storage device 120 as a component. Generally, the computer system 110 includes any suitable computer device, such as a computer, a laptop computer, a tablet device, a netbook, an internet kiosk, a personal digital assistant, a mobile phone, a smart phone, a gaming device, a computer server, a peripheral component interconnect (PCI), a serial AT attachment (SATA), or any other computing device. In some implementations, the computer system 110 includes one or more processors, one or more types of memory, a display, and/or other user interface components such as a keyboard, a touch screen display, a mouse, a trackpad, a digital camera, and/or any number of supplemental devices to add functionality.

The storage device 120 includes one or more storage mediums 130 (e.g., N storage mediums 130-1, 130-2, and 130-N, where N is an integer greater than or equal to 1). The storage medium(s) 130 are coupled to a storage controller 124 through data connections of a channel 103. In various implementations, the storage controller 124 and storage medium(s) 130 are included in the same device (e.g., storage device 120) as constituent components thereof, while in other embodiments, the storage controller 124 and storage medium(s) 130 are, or are in, separate devices. In some embodiments, the storage controller 124 is an application-specific integrated circuit (ASIC). The storage medium(s) 130 are optionally referred to as the NAND.

Each storage medium 130 includes control logic 132-1, 132-2, and 132-N (hereafter referred to as control logic 132) and data storage 134-1, 134-2, and 134-N (hereafter referred to as data storage 134). The data storage 134 may comprise any number (i.e., one or more) of memory devices including, without limitation, non-volatile semiconductor memory devices, such as flash memory. Flash memory devices can be configured for enterprise storage suitable for applications such as cloud computing, and/or configured for relatively smaller-scale applications such as personal flash drives or hard-disk replacements for personal, laptop and tablet computers.

In some implementations, the storage controller 124 includes a management module 121, an error control module 125, a storage medium interface 128, and a host interface 129. In some implementations, the storage controller 124 includes various additional features that have not been illustrated for the sake of brevity, and so as not to obscure more pertinent features of the example implementations disclosed herein. As such, a different arrangement of features may be possible.

The host interface 129 couples the storage device 120 and its storage controller 124 to one or more computer systems 110. The host interface 129 typically includes data buffers (not shown) to buffer data being received and transmitted by the storage device 120 via the data connections 101.

The storage medium interface 128 couples the storage controller 124 to the storage medium(s) 130. The storage medium interface 128 provides an interface to the storage medium(s) 130 though the data connections of the channel 103. In some implementations, the storage medium interface 128 includes read and write circuitry.

The error control module 125 is coupled between the storage medium interface 128 and the host interface 129. In some implementations, the error control module 125 is provided to limit the number of uncorrectable errors inadvertently introduced into data. To that end, the error control module 125 includes an encoder 126 and a decoder 127. The encoder 126 encodes data to produce a codeword which is subsequently stored in a storage medium 130. When the encoded data is read from the storage medium 130, the decoder 127 applies a decoding process to recover the data and correct errors within the error correcting capability of the error control code. Various error control codes have different error detection and correction capacities, and particular codes are selected for various applications.

The management module 121 typically includes one or more processors 122 (sometimes referred to herein as CPUs, processing units, hardware processors, processors, microprocessors or microcontrollers) for executing modules, programs and/or instructions stored in memory and thereby performing processing operations. However, in some implementations, the processor(s) 122 are shared by one or more components within, and in some cases, beyond the function of the storage controller 124. The management module 121 is coupled by communication buses to the host interface 129, the error control module 125, and the storage medium interface 128 in order to coordinate the operation of these components.

The management module 121 also includes memory 123 (sometimes referred to herein as controller memory), and one or more communication buses for interconnecting the memory 123 with the processor(s) 122. Communication buses optionally include circuitry (sometimes called a chipset) that interconnects and controls communications between system components. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise re-arranged in various embodiments. In some embodiments, the memory 123 may store a subset of modules and data structures. Furthermore, the memory 123 may store additional modules and data structures. In some embodiments, the programs, modules, and data structures stored in the memory 123, or the non-transitory computer readable storage medium of the memory 123, provide instructions for implementing any of the methods described below. Stated another way, the programs or modules stored in the memory 123, when executed by the one or more processors 122, cause the storage device 120 to perform any of the operations described below. Although FIG. 1 shows various modules, FIG. 1 is intended more as functional description of the various features which may be present in the modules than as a structural schematic of the embodiments described herein. In practice, the programs, modules, and data structures shown separately could be combined, and some programs, modules, and data structures could be separated.

Figure 2:
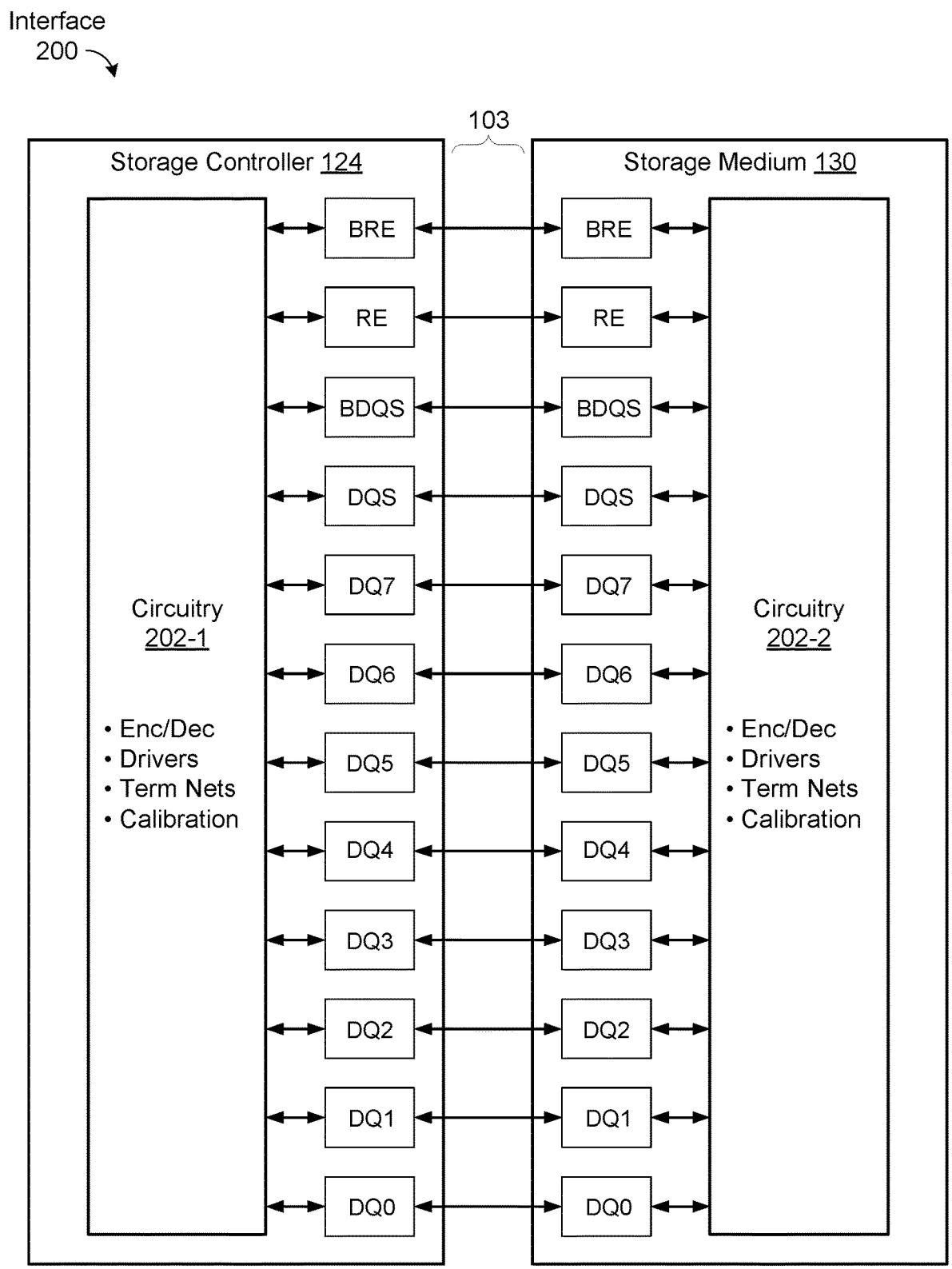
FIG. 2 is a block diagram of an electrical interface and data bus in accordance with some implementations.

FIG. 2 is a detailed diagram of an electrical interface 200 connecting the storage controller 124 and the storage medium 130 in accordance with some implementations. The interface 200 includes channel 103 (also referred to as a bus), which includes data connections (also referred to as lines, signals, and/or wires). The data connections connect data and control signal pads of the storage medium interface 128 of the storage controller 124 with corresponding data and control signal pads of the controller interface 200 of storage medium(s) 130. The channel 103 includes a plurality of data bits (e.g., an N-bit data bus including DQ0 through DQN data bits, where N is greater than or equal to 1), and various control signals (e.g., data strobe signals DQS/BDQS, signals RE/BRE, and optionally other control signals not shown).

Each side of the interface 200 (the storage controller 124 side and the storage medium 130 side) includes circuitry 202, which may include any combination of encoding/decoding circuitry, drivers, termination networks, and calibration circuitry. The circuitry 202 is configured to encode data bits (e.g., DQ0 through DQ7) for output to the channel 103, and decode data bits received from the channel 103. An example data path includes:

an encoder in circuitry 202-1 of the storage controller 124 configured to encode data for transmission via a particular data connection of the channel 103 (e.g., DQ0), a driver in circuitry 202-1 of the storage controller 124 configured to drive a data signal high (logic 1) or low (logic 0), a data connection in channel 103 connecting a pad of the particular data connection (e.g., DQ0) of the storage controller 124 with a corresponding pad of the particular data connection (e.g., DQ0) of the storage medium 130, a termination network in circuitry 202-2 of the storage medium 130 configured to terminate the data signal (e.g., by impedance matching), and a decoder in circuitry 202-2 of the storage medium 130 configured to decode the received data signal.

FIG. 3 depicts a signaling scheme 300 in accordance with some implementations. The signaling scheme 300 is implemented across: (i) driver circuitry in storage controller 124 including a pull-up circuit Rpu (e.g., including a PMOS transistor) for driving a logic 1 signal, and a pull-down circuit Rpd (e.g., including an NMOS transistor) for driving a logic 0 signal; (ii) channel 103; and (iii) termination circuitry in storage medium 130 including two termination resistors Rodt in a pull-up/pull-down configuration. Since the termination resistors have the same value, the data signal has a common mode voltage of half of the voltage supply (VDDQ/2), referred to as reference voltage VREF. The value of Rodt may be selected based on a desired voltage swing.

In the signaling scheme 300 depicted in FIG. 3, the drive circuitry is in the storage controller 124 and the termination circuitry is in the storage medium 130. In this configuration, the storage controller 124 may write data to the storage medium 130 by using the driver circuitry to transmit a signal across the channel 103 to the termination circuitry in the storage medium 130. The opposite configuration (not shown) may also be implemented in order to enable the storage controller 124 to read data from the storage medium 130. Specifically, upon receiving a read command from the storage controller 124, the storage medium 130 may use driver circuitry (including a pull-up circuit Rpu and/or a pull-down circuit Rpd) to transmit a signal across the channel 103 to termination circuitry (including termination resistors) in the storage controller 124.

The size of the voltage swing affects decoding complexity. The larger the voltage swing, the simpler the decoding/receiving circuitry, due to the relatively large size of the data eye (the area of the data signal between transitions). However, the size of the voltage swing also affects power requirements and frequency limitations of the interface 200. Larger voltage swings mean more power is required to transmit data across the channel 103, and lower transmission frequency may be achieved due to limited available current to charge the higher swing (frequency is reduced since, for a given current, a higher voltage needs to be charged). As such, lower voltage swings are desirable due to decreased power requirements and increased transmission frequency. However, the lower the voltage swing, the more complicated the decoding/receiving circuitry due to the reduced size of the data eye. The smaller the data eye, the more VREF is subject to component tolerances (described with reference to FIG. 4 below), thereby making it more difficult for the decoder to accurately sample data without subjecting the electronic components and voltages to time consuming calibration.

FIG. 4 depicts a signaling scheme 400 in accordance with some implementations. Signaling scheme 400 is implemented across: (i) driver circuitry in storage controller 124 including a pull-up circuit Rpu (e.g., including a PMOS transistor) for driving a logic 1 signal, and a pull-down circuit Rpd (e.g., including an NMOS transistor) for driving a logic 0 signal; (ii) channel 103; and (iii) termination circuitry in storage medium 130 including one termination resistor Rodt in a pull-down configuration. The values of Rpu and Rodt may be chosen to set the high-level output voltage VOH (equal to Rodt/(Rodt+Rpu)) and the common mode reference voltage VREF (equal to half of VOH) to lower values compared to those in signaling scheme 300. For example, VOH may be set to one third of the supply voltage (VDDQ/3) and VREF may be set to one sixth of the supply voltage (VDDQ/6). Other implementations may set lower or higher VREF values. Since there is no pull-up resistor in the termination circuitry, logic 0 may be signaled as 0V, thereby saving power. Signaling scheme 400 may be referred to as a low voltage swing terminated logic (LVSTL) scheme.

In the signaling scheme 400 depicted in FIG. 4, the drive circuitry is in the storage controller 124 and the termination circuitry is in the storage medium 130. In this configuration, the storage controller 124 may write data to the storage medium 130 by using the driver circuitry to transmit a signal across the channel 103 to the termination circuitry in the storage medium 130. The opposite configuration (described below with reference to FIG. 6) may also be implemented in order to enable the storage controller 124 to read data from the storage medium 130. Specifically, upon receiving a read command from the storage controller 124, the storage medium 130 may use driver circuitry (including a pull-up circuit Rpu and/or a pull-down circuit Rpd) to transmit a signal across the channel 103 to termination circuitry (including a termination resistor) in the storage controller 124.

The voltage swing between 0V and VOH is much lower than that in signaling scheme 300 (e.g., half the voltage swing). For example, the voltage swing in signaling scheme 300 may be 800 mV, while the voltage swing in signaling scheme 400 may be 400 mV. Other implementations may set lower or higher voltage swings. As noted above, the reduced voltage swing allows for reduced transmission power and increased transmission frequency. However, decoding complexity is increased due to the higher sensitivity of the data eye to tolerances in Rpu, Rodt, and supply voltage VDD.

As a result of the higher sensitivity of the data eye to impedance and voltage tolerances, sampling voltages for write and read operations must be trained to the particular data eye for each data connection for each storage medium 130 that is interfaced with a storage controller 124. For example, VREF may be varied for a particular data connection until an optimal value is found for the data connection. However, VREF training may be inefficient due to the amount of time it typically takes and the fact that it needs to be successively applied to every data connection of every storage medium 130. Further, VREF training typically requires calibration of components in the storage controller 124 and the storage medium 130. Calibrating components across both the controller and the storage medium adds time and complexity to the training process. As such, the voltage training implementations described with reference to FIGS. 5A-7 below address these timing and complexity issues.

FIGS. 5A-5B depict a voltage training scheme 500 for training VOH during a write mode in accordance with some implementations. The voltage training scheme 500 is implemented by calibration circuitry 202 (FIG. 2) associated with the signaling scheme 400 of FIG. 4. In voltage training scheme 500, for each data connection (e.g., for each data signal DQx), the pull-up circuit Rpu of the storage controller 124 is first calibrated against the termination circuitry Rodt of the storage medium 130 (FIG. 5A), and the pull-down circuit Rpd of the storage controller 124 is calibrated against the pull-up circuit Rpu of the storage controller 124 (FIG. 5B). In voltage training scheme 500, the voltage training is completely performed by the storage controller 124 on components of the storage controller 124 (as opposed to voltage training at both the storage controller 124 and the storage medium 130), which optimizes the amount of time required to perform the voltage training. Further, since voltage training is done at the product level, any mismatch between components in the storage controller 124 and the storage medium 130 can be completely compensated.

Before the storage controller 124 performs voltage training scheme 500 for a particular storage medium 130, the particular storage medium 130 calibrates its driver and termination circuitry using an internal data bus (referred to herein as ZQ) and a predetermined external resistance Rext. As a result, Rodt of the storage medium 130 is calibrated before the storage controller 124 performs the voltage training scheme 500.

To calibrate the pull-up driver Rpu for a particular data signal DQx (e.g., DQ0), the storage controller 124 causes the storage medium 130 to turn on (502) or otherwise enable termination circuitry Rodt for the particular data signal. The storage controller 124 turns on (504) or otherwise enables pull-up driver Rpu for the particular data signal DQx to be calibrated against Rodt of the storage medium 130. The storage controller 124 calibrates (506) pull-up driver Rpu for the particular data signal DQx.

In some implementations, the storage controller 124 calibrates Rpu by successively incrementing a write voltage across Rpu until the voltage at the output node of the channel 103 (Vtest) is within a predetermined threshold of VOH. For example, N (e.g., 32) write voltages may be successively applied across Rpu, with each successive write voltage incremented by a predetermined step. For each successively applied write voltage, Vtest is compared with a fixed voltage representing VOH. When a particular write voltage causes Vtest to come within a predetermined threshold of VOH (e.g., is equal to the threshold of VOH or substantially matches (e.g., within a percentage difference such as 5%) the threshold of VOH), storage controller 124 stores (508) a calibration code (Code P) representing the particular write voltage associated with the particular data signal DQx for the particular storage medium 130. The storage controller 124 subsequently (510) calibrates Rpu for the next data signal (e.g., DQ1), until Rpu for each data signal (e.g., DQ0-DQ7, DQS/BDQS, RE/BRE, etc.) is calibrated to corresponding Rodt values for a particular storage medium 130.

To calibrate the pull-down driver Rpd for a particular data signal DQx (e.g., DQ0), the storage controller 124 turns on (522) or otherwise enables an internal data signal ZQ (e.g., a data signal enabled during an internal calibration mode). The storage controller 124 sets (524) the pull-up driver Rpu for the particular data signal DQx to a value in accordance with the calibration code (Code P) determined in operation 508 above. Stated another way, the storage controller 124 sets Rpu to the value determined as having produced a Vtest within a predetermined threshold of VOH during the Rpu calibration operation. The storage controller 124 calibrates (526) pull-down driver Rpd for the particular data signal DQx.

In some implementations, the storage controller 124 calibrates Rpd by successively incrementing a write voltage across Rpu and Rpd until the voltage at the output node of the channel 103 (Vtest) is within a predetermined threshold of VOH. For example, N (e.g., 32) write voltages may be successively applied across Rpu and Rpd, with each successive write voltage incremented by a predetermined step. For each successively applied write voltage, Vtest is compared with a fixed voltage representing VOH. When a particular write voltage causes Vtest to come within a predetermined threshold of VOH (e.g., is equal to the threshold of VOH or substantially matches (e.g., within a percentage difference such as 5%) the threshold of VOH), storage controller 124 stores (528) a calibration code (Code N) representing the particular write voltage associated with the particular data signal DQx for the particular storage medium 130. The storage controller 124 subsequently (530) calibrates Rpd for the next data signal (e.g., DQ1), until Rpd for each data signal (e.g., DQ0-DQ7, DQS/BDQS, RE/BRE, etc.) is calibrated to corresponding Rpu values of the storage controller 124.

Figure 6:
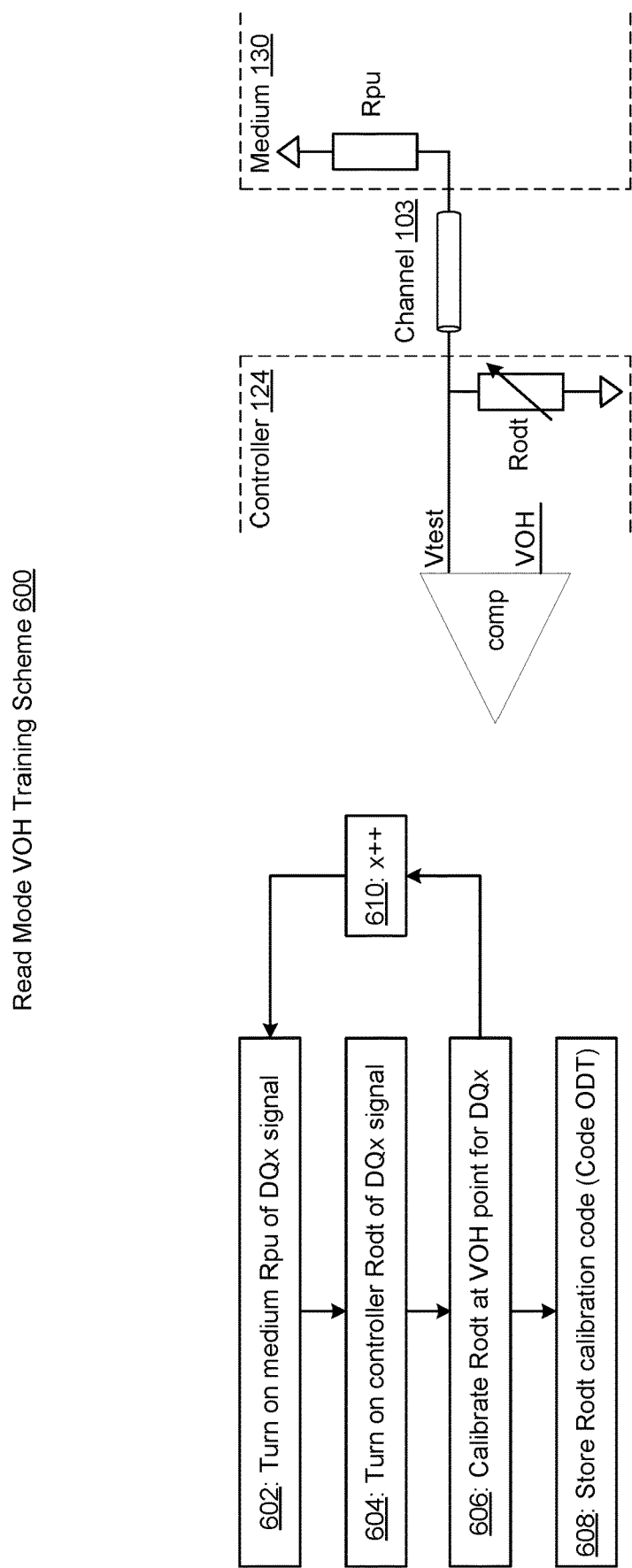
FIG. 6 depicts a voltage training scheme during a read mode in accordance with some implementations.

FIG. 6 depicts a voltage training scheme 600 for training VOH during a read mode in accordance with some implementations. The voltage training scheme 600 is implemented by calibration circuitry 202 (FIG. 2) associated with the signaling scheme 400 of FIG. 4. In voltage training scheme 600, for each data connection (e.g., for each data signal DQx), the termination circuitry Rodt of the storage controller 124 is calibrated against the pull-up driver Rpu of a particular storage medium 130. In voltage training scheme 600, the voltage training is completely performed by the storage controller 124 on components of the storage controller 124 (as opposed to voltage training at both the storage controller 124 and the storage medium 130), which optimizes the amount of time required to perform the voltage training.

To calibrate Rodt for a particular data signal DQx (e.g., DQ0), the storage controller 124 causes the storage medium 130 to turn on (602) or otherwise enable a pull-up driver Rpu for the particular data signal. The storage controller 124 turns on (604) or otherwise enables Rodt for the particular data signal DQx to be calibrated against Rpu of the storage medium 130. The storage controller 124 calibrates (606) Rodt for the particular data signal DQx.

In some implementations, the storage controller 124 calibrates Rodt by causing the storage medium 130 to successively increment a transmission voltage across Rpu until the voltage at the input node of the channel 103 (Vtest) is within a predetermined threshold of VOH. For example, N (e.g., 32) transmission voltages may be successively applied across Rpu, with each successive transmission voltage incremented by a predetermined step. For each successively applied transmission voltage, Vtest is compared with a fixed voltage representing VOH. When a particular transmission voltage causes Vtest to come within a predetermined threshold of VOH (e.g., is equal to the threshold of VOH or substantially matches (within a percentage difference such as 5%) the threshold of VOH), storage controller 124 stores (608) a calibration code (Code ODT) representing the particular transmission voltage associated with the particular data signal DQx for the particular storage medium 130. The storage controller 124 subsequently (610) calibrates Rodt for the next data signal (e.g., DQ1), until Rodt for each data signal (e.g., DQ0-DQ7, DQS/BDQS, RE/BRE, etc.) is calibrated to corresponding Rpu values for a particular storage medium 130.

Figure 7:
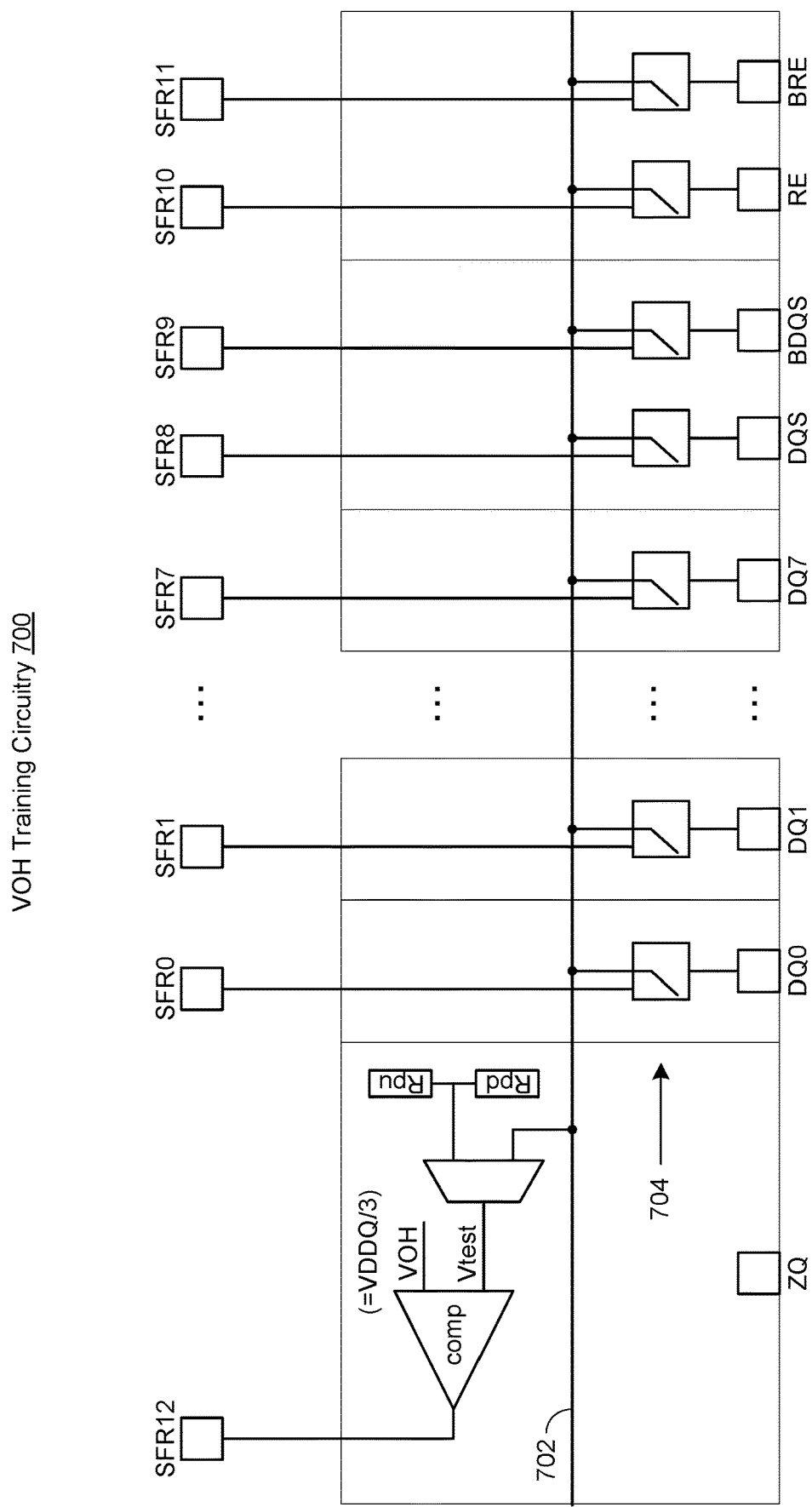
FIG. 7 is a block diagram of voltage training circuitry in accordance with some implementations.

FIG. 7 is a block diagram of voltage training circuitry 700 for training VOH in accordance with some implementations. Each signal (e.g., DQ through DQ7, DQS/BDQS, RE/BRE) is successively calibrated as described above with reference to voltage training schemes 500 and 600. A plurality of switches 704 are successively closed in order to train VOH for each successive signal. As each set of calibration codes (Code P for Rpu, Code N for Rpd, and Code ODT for Rodt) is determined in operations 508, 528, and 608 for a particular signal (e.g., DQ0), a corresponding register (e.g., SFR0) stores one or more of the calibration codes. Node 702 corresponds with the Vtest node in FIGS. 5A and 5B, and as each successive switch 704 is closed, drive circuitry and/or termination circuitry for a corresponding signal is calibrated as described above with reference to FIGS. 5A-6.

Each set of calibration codes determined in operations 508, 528, and 608 (Code P for Rpu, Code N for Rpd, and Code ODT for Rodt) may be stored in the particular storage medium 130 for which VOH was trained. As such, for subsequent write and read operations involving a particular storage medium 130, the storage controller 124 may load the stored calibration codes for that particular storage medium 130 and use the calibration codes during the subsequent write and read operations in order to keep the VREF and VOH voltages, as well as voltage swing, intact.

The voltage training implementations described herein account for (i) relative mismatch between storage controller driver impedance and storage medium on-die termination, and (ii) relative mismatch between storage controller on-die termination and storage medium driver impedance. The voltage training implementations described herein account for these mismatches by tuning the relative impedance of storage controller drivers and on-die termination against storage medium on-die termination and drivers. Since the storage medium is already calibrated against an external reference and the storage controller is calibrated against the storage medium, the systematic impedance/on-die termination mismatch can be removed or reduced. This can be accomplished without VREF calibration for data recovery.

The foregoing description has been described with reference to specific implementations. However, the illustrative discussions above are not intended to be exhaustive or to limit the claims to the precise forms disclosed. Many variations are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a", "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A data storage system, comprising:
    a storage medium including a plurality of memory cells;
    a storage controller in communication with the storage medium;
    an electrical interface configured to pass data via a channel disposed between (i) a first interface circuitry included in one of the storage controller and the storage medium and (ii) a second interface circuitry included in the other of the storage controller and the storage medium;
    voltage training circuitry configured to train a high-level output voltage (VOH) for each of a plurality of data lines of the channel;
    wherein training the VOH comprises, for each of the plurality of data lines of the channel:
        calibrating a pull-up driver of the first interface circuitry against an on-die termination circuit of the second interface circuitry;
        calibrating a pull-down driver of the first interface circuitry against the pull-up driver of the first interface circuitry; and
        calibrating an on-die termination circuit of the first interface circuitry against a pull-up driver of the second interface circuitry.

2. The data storage system of claim 1, wherein calibrating the pull-up driver of the first interface circuitry comprises:
    sweeping a plurality of write voltages across the pull-up driver;
    comparing (i) output voltages associated with respective write voltages of the plurality of write voltages with (ii) a test VOH voltage;
    determining, based on the comparing, that a particular output voltage substantially matches the test VOH voltage; and
    storing first calibration data associated with the particular output voltage.

3. The data storage system of claim 2, wherein calibrating the pull-down driver of the first interface circuitry comprises:
    setting an impedance of the pull-up driver based on the first calibration data;
    sweeping a plurality of write voltages across the pull-up driver and the pull-down driver;
    comparing (i) output voltages associated with respective write voltages of the plurality of write voltages with (ii) the test VOH voltage;
    determining, based on the comparing, that a second particular output voltage substantially matches the test VOH voltage; and
    storing second calibration data associated with the second particular output voltage.

4. The data storage system of claim 3, wherein calibrating the on-die termination circuit of the first interface circuitry comprises:
    sweeping a plurality of transmission voltages across the pull-up driver of the second interface circuitry;
    comparing (i) input voltages associated with respective transmission voltages of the plurality of transmission voltages with (ii) a test VOH voltage;
    determining, based on the comparing, that a particular input voltage substantially matches the test VOH voltage; and
    storing third calibration data associated with the particular input voltage.

5. The data storage system of claim 4, further comprising write circuitry configured to write data to the second interface circuitry based on the first and second calibration data.

6. The data storage system of claim 4, further comprising read circuitry configured to read data from the second interface circuitry based on the third calibration data.

7. The data storage system of claim 4, wherein the electrical interface is configured to implement a low voltage swing terminated logic signaling scheme.

8. A method of operating a data storage system comprising a storage medium including a plurality of memory cells, a storage controller in communication with the storage medium, and an electrical interface configured to pass data via a channel disposed between (i) a first interface circuitry included in one of the storage controller and the storage medium and (ii) a second interface circuitry included in the other of the storage controller and the storage medium, the method comprising:
    training a high-level output voltage (VOH) for each of a plurality of data lines of the channel, including:

calibrating a pull-up driver of the first interface circuitry against an on-die termination circuit of the second interface circuitry;
calibrating a pull-down driver of the first interface circuitry against the pull-up driver of the first interface circuitry; and
calibrating an on-die termination circuit of the first interface circuitry against a pull-up driver of the second interface circuitry.

9. The method of claim 8, wherein calibrating the pull-up driver of the first interface circuitry comprises:
sweeping a plurality of write voltages across the pull-up driver;
comparing (i) output voltages associated with respective write voltages of the plurality of write voltages with (ii) a test VOH voltage;
determining, based on the comparing, that a particular output voltage substantially matches the test VOH voltage; and
storing first calibration data associated with the particular output voltage.

10. The method of claim 9, wherein calibrating the pull-down driver of the first interface circuitry comprises:
setting an impedance of the pull-up driver based on the first calibration data;
sweeping a plurality of write voltages across the pull-up driver and the pull-down driver;
comparing (i) output voltages associated with respective write voltages of the plurality of write voltages with (ii) the test VOH voltage;
determining, based on the comparing, that a second particular output voltage substantially matches the test VOH voltage; and
storing second calibration data associated with the second particular output voltage.

11. The method of claim 10, wherein calibrating the on-die termination circuit of the first interface circuitry comprises:
sweeping a plurality of transmission voltages across the pull-up driver of the second interface circuitry;
comparing (i) input voltages associated with respective transmission voltages of the plurality of transmission voltages with (ii) a test VOH voltage;
determining, based on the comparing, that a particular input voltage substantially matches the test VOH voltage; and
storing third calibration data associated with the particular input voltage.

12. The method of claim 11, further comprising write circuitry configured to write data to the second interface circuitry based on the first and second calibration data.

13. The method of claim 11, further comprising read circuitry configured to read data from the second interface circuitry based on the third calibration data.

14. The method of claim 11, wherein the electrical interface is configured to implement a low voltage swing terminated logic signaling scheme.

15. A data storage system, comprising:
a storage medium including a plurality of memory cells;
a storage controller in communication with the storage medium;
an electrical interface configured to pass data via a channel disposed between (i) a first interface circuitry included in one of the storage controller and the storage medium and (ii) a second interface circuitry included in the other of the storage controller and the storage medium;
voltage training means for training a high-level output voltage (VOH) for each of a plurality of data lines of the channel, including:
first calibration means for calibrating a pull-up driver of the first interface circuitry against an on-die termination circuit of the second interface circuitry;
second calibration means for calibrating a pull-down driver of the first interface circuitry against the pull-up driver of the first interface circuitry; and
third calibration means for calibrating an on-die termination circuit of the first interface circuitry against a pull-up driver of the second interface circuitry.

16. The data storage system of claim 15, wherein the first calibration means include:
means for sweeping a plurality of write voltages across the pull-up driver;
means for comparing (i) output voltages associated with respective write voltages of the plurality of write voltages with (ii) a test VOH voltage;
means for determining, based on the comparing, that a particular output voltage substantially matches the test VOH voltage; and
means for storing first calibration data associated with the particular output voltage.

17. The data storage system of claim 16, wherein the second calibration means include:
means for setting an impedance of the pull-up driver based on the first calibration data;
means for sweeping a plurality of write voltages across the pull-up driver and the pull-down driver;
means for comparing (i) output voltages associated with respective write voltages of the plurality of write voltages with (ii) the test VOH voltage;
means for determining, based on the comparing, that a second particular output voltage substantially matches the test VOH voltage; and
means for storing second calibration data associated with the second particular output voltage.

18. The data storage system of claim 17, wherein the third calibration means include:
means for sweeping a plurality of transmission voltages across the pull-up driver of the second interface circuitry;
means for comparing (i) input voltages associated with respective transmission voltages of the plurality of transmission voltages with (ii) a test VOH voltage;
means for determining, based on the comparing, that a particular input voltage substantially matches the test VOH voltage; and
means for storing third calibration data associated with the particular input voltage.

19. The data storage system of claim 18, further comprising means for writing data to the second interface circuitry based on the first and second calibration data.

20. The data storage system of claim 18, further comprising means for reading data from the second interface circuitry based on the third calibration data.

* * * * *